United States Patent [19]

Arney et al.

[11] Patent Number: 4,532,200
[45] Date of Patent: Jul. 30, 1985

[54] PHOTOSENSITIVE IMAGING MATERIAL EMPLOYING ENCAPSULATED RADIATION SENSITIVE COMPOSITION HAVING IMPROVED TOE SPEED

[75] Inventors: Jonathan S. Arney; Paul C. Adair, both of Chillicothe, Ohio

[73] Assignee: The Mead Corporation, Dayton, Ohio

[21] Appl. No.: 552,569

[22] Filed: Nov. 16, 1983

[51] Int. Cl.$^3$ .................... G03C 5/54; G03C 1/68; G03C 1/71
[52] U.S. Cl. .................... 430/138; 430/211; 346/205; 346/209
[58] Field of Search ............... 430/138, 211; 282/27.5; 346/205, 209

[56] References Cited

U.S. PATENT DOCUMENTS

| | | | |
|---|---|---|---|
| 3,219,446 | 11/1965 | Berman | 430/138 |
| 4,399,209 | 8/1983 | Sanders et al. | 430/138 |
| 4,416,966 | 11/1983 | Sanders et al. | 430/138 |

FOREIGN PATENT DOCUMENTS

| | | | |
|---|---|---|---|
| 124343 | 8/1982 | Japan | 430/138 |
| 179836 | 11/1982 | Japan | 430/138 |
| 197538 | 12/1982 | Japan | 430/138 |
| 17432 | 1/1983 | Japan | 430/138 |
| 23024 | 2/1983 | Japan | 430/138 |
| 23025 | 2/1983 | Japan | 430/138 |
| 45084 | 3/1983 | Japan | 430/138 |
| 45090 | 3/1983 | Japan | 430/138 |
| 1001832 | 7/1962 | United Kingdom | 430/138 |
| 1141475 | 6/1966 | United Kingdom | 430/138 |

Primary Examiner—Richard L. Schilling
Attorney, Agent, or Firm—Biebel, French & Nauman

[57] ABSTRACT

An imaging material of the type in which a radiation sensitive composition is encapsulated in a plurality of microcapsules and exposure controls the release of the internal phase from the microcapsules and mobilization of an image-forming agent in which faster toe speed and higher gamma are obtained by sequestering a predetermined amount of the image-forming agent mobilized upon rupturing the microcapsules.

11 Claims, 8 Drawing Figures

PHOTOSENSITIVE IMAGING MATERIAL EMPLOYING ENCAPSULATED RADIATION SENSITIVE COMPOSITION HAVING IMPROVED TOE SPEED

BACKGROUND OF THE INVENTION

The present invention relates to a photosensitive imaging material of the type in which a radiation sensitive composition is encapsulated in a plurality of microcapsules and exposure of the composition controls the release of the internal phase from the microcapsules. In the areas in which the internal phase is released an image-forming agent is mobilized and an image is formed. More particularly, the present invention relates to a technique for improving the toe speed of such imaging materials by chemically or physically sequestering a predetermined quantity of the mobilized image-forming agent associated with the capsules.

Photosensitive imaging materials employing encapsulated radiation sensitive compositions are the subject of commonly assigned U.S. Pat. No. 4,399,209 to Sanders et al and U.S. applications Ser. Nos. 320,643 filed Nov. 12, 1981 and 339,917 filed Jan. 18, 1982, as well as Japanese Kokai Nos. 57-124,343 (Aug. 3, 1982) and 57-179836 (Nov. 5, 1982) to Fuji Photo Film Company, Ltd., and Japanese Kokai Nos. 58-17,432 (Feb. 1, 1983) and 58-23,024 (Feb. 10, 1983) to Mitsubishi Paper Mills Corp. In these systems, images are typically formed by reacting a color precursor with a color developer. The color precursor is typically encapsulated with a radiation sensitive composition such as a composition of a polyethylenically unsaturated compound and a photoinitiator.

By image-wise exposing these materials to actinic radiation and rupturing the capsules in the presence of the color developer (which may be on the same support or a separate support from the photoactive microcapsules), the color precursor is image-wise released from the microcapsules and a color image (the reaction product of the color precursor and the color developer) is obtained.

Other imaging systems employing photoactive microcapsules are described in the following patents:

Berman, U.S. Pat. No. 3,219,446 discloses a transfer imaging system in which a blue-black dye is encapsulated with a photocrosslinkable polymer or a photopolymerizable monomer. Images are produced by exposing a layer of the encapsulated material to light and rupturing the capsules in contact with an image-receiving sheet.

Phillips, U.S. Pat. No. 3,700,439, discloses an imaging process in which Michler's ketone is encapsulated and provided as a layer on a support. Irradiation of Michler's ketone converts it to a colorless, acid colorable, dye precursor. Thus, by image-wise exposing the Phillips material to actinic radiation and rupturing the microcapsules in contact with an acid developer layer, a visible image is obtained in the areas in which the ketone is converted to its acid colorable form.

Levy, U.S. Pat. No. 4,149,887, relates to an imaging material in which the microcapsules contain a photoconductive internal phase. By exposing the material in an R.F. field, the conductivity of the internal phase increases so that the microcapsules heat and rupture and thereby release the internal phase which may contain a color precursor which reacts with a developing agent to form an image.

Japanese Kokai, No. 6212/1974 to Matsushiti Denki Sangyo K.K. relates to a recording material in which microcapsules containing a colorless or substantially colorless precursor in a polar solvent are formed with a photocrosslinkable polymer wall material. Images are formed by image-wise exposing the material to actinic radiation to harden the microcapsule walls in the exposed areas, and rupturing the microcapsules in the unexposed areas in contact with a developer material. Thereupon the polar solvent evaporates and a color-producing reaction occurs between the color former and developer.

British Pat. Nos. 1,001,832; 1,058,798; 1,141,475; and 1,193,923 to DuPont disclose an imaging material in which a photopolymerizable substratum contains an ethylenically unsaturated compound. By image-wise exposing the material, the rate of diffusion of an externally applied developer or a color precursor into or out of the photopolymerizable substratum is controlled and images are formed.

DEFINITIONS

The term "microcapsule" as used herein refers to both microcapsules having a discrete wall and microcapsules formed in an open phase system wherein discrete droplets of internal phase are dispersed in a binder. Thus, whenever reference is made to "microcapsules" or "encapsulation" herein, without reference to a discrete microcapsule wall, both types of microcapsules are intended.

The term "actinic radiation" includes the entire spectrum of electromagnetic radiation such as visible, ultra-violet, and infrared radiation, and x-ray or ion beam radiaiton.

SUMMARY OF THE INVENTION

The present invention relates to an imaging material employing a microencapsulated radiation sensitive composition having faster toe speed and to a process for developing such imaging materials which provides faster toe speed.

The imaging materials described in the aforementioned U.S. patent and applications to Mead Corporation have been useful in providing good quality images with good tonal characteristics. However, the toe speed of these materials is not as fast as would be desirable for certain applications and, particularly, for forming a high contrast image with moderate exposure. One application in which fast toe speed and high gamma are desired is in making photocopies of X-ray photographs.

In accordance with the present invention, the toe speed of imaging materials employing microencapsulated radiation sensitive compositions is increased by sequestering a predetermined quantity of the image-forming agent which is mobilized when the internal phase is released from the microcapsules. The sequestered quantity is substantially the same in the high density and low density image areas such that a predetermined quantity of mobilized image-forming agent does not contribute to the image density. In the high density areas this has a small effect on imaging speed whereas in the low density areas the effect is large and a substantial increase in toe speed and gamma is achieved.

The image-forming agent can be sequestered by building into the imaging material a physical or chemical mechanism for absorbing, entrapping, isolating, or neutralizing the mobilized image-forming agent. Alternatively, sequestration can be accomplished upon development, for example, by treating the imaging material to remove a predetermined quantity of the image-forming agent activated upon rupturing the microcapsules or by reversing a predetermined quantity of the image-forming reaction.

DETAILED DESCRIPTION OF THE INVENTION

The effect which sequestering a predetermined amount of the image-forming agent has on toe speed can be illustrated mathematically by reference to the Kubelka-Munk equation:

$$K/S = (1-R)^2/R \quad (1)$$

wherein K/S is the ratio of absorbance K of the dye formed on development to the scattering constant S of the substrate and R is reflectivity. The Kubelka-Munk relationship can be rewritten in terms of image density D as follows:

$$K/S = (1-10^{-D})^2/10^{-D} \quad (2)$$

Since the value of S, the scattering coefficient, is substantially constant, the ratio of K/S is directly proportional to the quantity of image-forming agent delivered to the developer coating upon rupturing the microcapsules. The response of a developer coating to the delivery of an image-forming agent, i.e., the stoichiometric relationship between the number of developed molecules of the image forming agent, K/S, and the number of molecules of the image-forming agent applied to the developer coating, Q, can be shown by plotting K/S versus Q.

Figure 1:
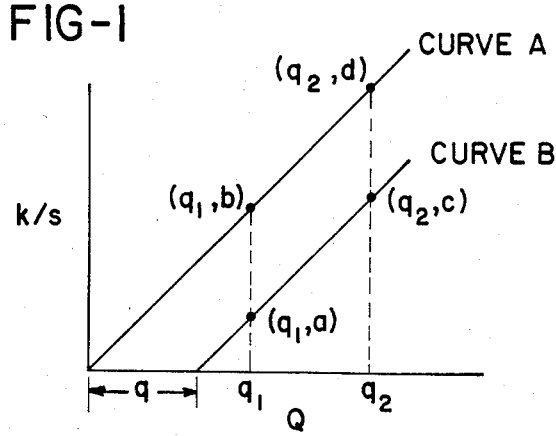
FIG. 1 is hypothetical developer response curves for a prior imaging material (Curve A) and an imaging material in accordance with the present invention (Curve B).

A typical example of a graph of developer response is shown in FIG. 1 where Curve A corresponds to a prior imaging material and Curve B corresponds to the imaging material of the present invention. Direct proportionality is observed between the number of developed molecules K/S and the number of applied molecules Q. The response Curve B is shifted to the right of Curve A a distance corresponding to the quantity of mobilized image-forming agent sequestered by the system, q. In accordance with the present invention no development occurs until the critical quantity, q, of image-forming agent is applied to the developer coating.

To further illustrate the present invention, FIG. 1 illustrates that a hypothetical quantity of image-forming agent, $q_1$, delivered to the developer coating provides a hypothetical number of developed molecules equal to b in a prior imaging material and a hypothetical number of developed molecules equal to a in the invention material. Likewise, in a high density region, a hypothetical quantity of image-forming agent, $q_2$, delivered to the developer material provides a quantity of d developed molecules in a prior material and c developed molecules in the invention material wherein b is greater than a and c is greater than d.

Figure 2:
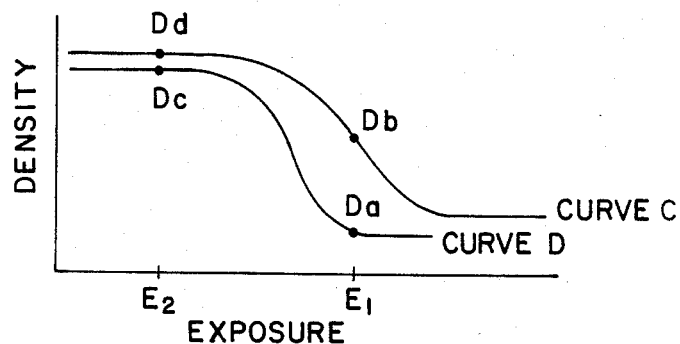
FIG. 2 is hypothetical H & D curves for a prior imaging material (Curve C) and an imaging material in accordance with the present invention (Curve D).

The effect of the shift from Curve A to Curve B on the photographic characteristics of the imaging material is shown in FIG. 2 wherein hypothetical H & D Curves are shown for a prior material (Curve C) and the invention material (Curve D).

Using the Kubelka-Munk equation, the hypothetical K/S values shown in FIG. 1 can be translated into the density values Da, Db, Dc and Dd shown on Curves C and D. Thus, for a predetermined exposure $E_1$, a quantity $q_1$ of image-forming agent would be mobilized upon rupturing the microcapsules in the imaging material, but by sequestering a quantity q of the image-forming agent, the density of the image produced in accordance with the present invention is Da whereas the density of the image produced with a prior material is Db. Similarly, for an exposure $E_2$, a quantity $q_2$ of image-forming agent is released from the capsules which translates via the Kubelka-Munk equation into density values Dc in the present invention and Dd in the prior material.

The difference between Da and Db is substantially greater than the difference between Dc and Dd and, for this reason by sequestering a predetermined quantity of image-forming agent in accordance with the present invention, the toe speed and gamma of the imaging material can be significantly increased. This can be mathematically illustrated as follows:

If it is assumed that the hypothetical value Dd in FIG. 2 is 1.0, using equation (2) above, the value of K/S corresponding to d is 8.10. If 25% of the image-forming agent is sequestered, the value of K/S corresponding to c is 6.075. Using this value and equation (2) above, the value Dc on Curve D is 0.90. Thus, by sequestering 25% of the image-forming agent, the density in the high density region of the H & D Curve is reduced from 1.0 to 0.9 density unit.

In the low density region, the effect is proportionately much greater. Assuming that the density corresponding to Db is 0.60, the value of K/S corresponding to b is 2.232. Subtracting 2.025 units of dye (K/S), as in the high density area, gives a value of 0.206 for a which corresponds to a calculated image density Da of 0.195. Thus, in the low density region, by sequestering 2.025 units of image forming agent, the density is reduced approximately 0.4 units compared with 0.1 unit in the high density area.

Having provided a mathematical basis for the present invention, imaging materials embodying means for sequestering a predetermined quantity of the image-forming agents are described below in detail.

Figure 3:
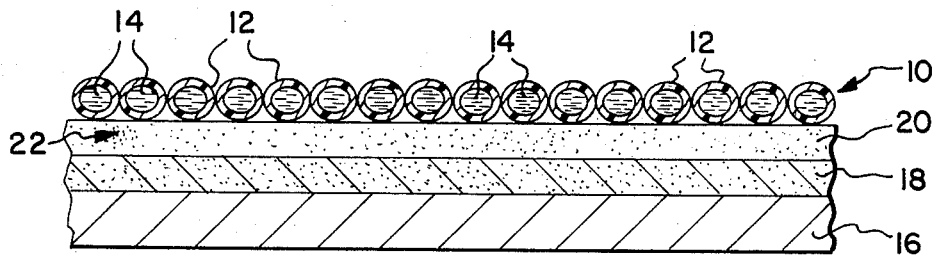
FIG. 3 is a cross-sectional view of a self-contained imaging sheet in accordance with the present invention including an image-forming agent sequestering layer.

FIG. 3 illustrates a self-contained imaging sheet in accordance with the present invention wherein a layer 10 of microcapsules 12 having an internal phase 14 containing a color precursor is provided on the same side of a support 16 as a color developer layer 18. A layer 20 for sequestering a predetermined quantity of the image-forming agent (in this case a color precursor molecule) mobilized upon releasing the internal phase from microcapsules 12 is interposed between the microcapsular layer 10 and the color developer layer 18.

The sequestering layer 20 includes a pigment or filler 22 which physically or chemically binds, neutralizes, imbibes or otherwise sequesters a predetermined quantity of the color precursor released from the microcapules 12. This sequesteration of the color precursor can be accomplished physically by, for example, entrapping, entraining or imbibing a predetermined quantity of the color precursor, or chemically by bonding a predetermined quantity of the color precursor by, for example, adsorbance, mordation, or the like; or by deactivating a predetermined quantity of the color precursor by reaction with a desensitizing agent or the like.

Figure 4:
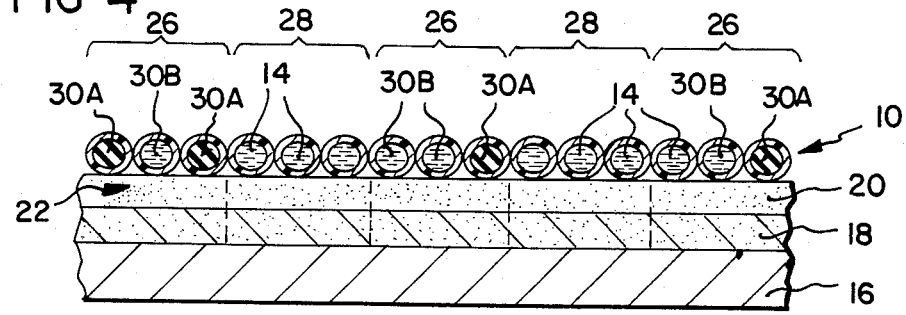
FIG. 4 is a cross-sectional representation of the imaging material of FIG. 3 following exposure.

The state of the imaging material of FIG. 3 following exposure is schematically shown in FIG. 4 for the case in which the internal phase includes a radiation curable composition such as a composition of a polyethylenically unsaturated compound and a photoinitiator. The layer 10 is shown as being divided into partially exposed areas 26 and unexposed areas 28. The partially exposed areas 26 (for purposes of illustration only) are shown as being made up of a mixture of microcapsules in some of which the internal phase is transformed into a solid mass 30A and in others the internal phase remains liquid 30B. In the unexposed areas 28 the internal phase retains its original liquid form 14.

The exposed imaging material of FIG. 4 can be developed using various techniques to rupture the microcapsules, however, the most common practice comprises passing the exposed imaging sheet through the nip between a pair of pressure rollers. Upon rupturing, the capsules in the unexposed areas 28 and the partially exposed areas 26 rupture and release the internal phase according to the degree of exposure.

Figure 5:
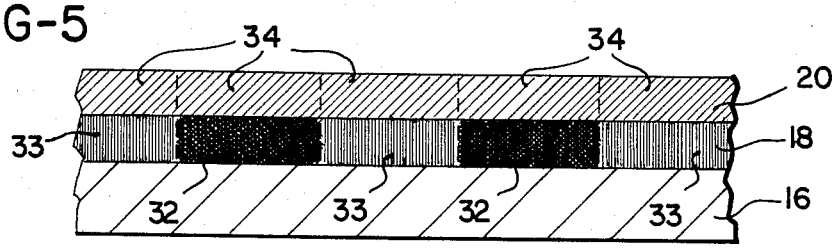
FIG. 5 is a cross-sectional representation of the developed imaging material of FIGS. 3 and 4.

As shown in FIG. 5, upon rupturing the unhardened microcapsules, the color precursor migrates through the sequestering layer 20 to the color developer layer 18. The same predetermined quantity of the color precursor released from the microcapsules in areas 26 and 28 is sequestered in layer 20 as shown at 34. The balance of the color precursor reacts with the developer material in layer 18 and produces a dense color image 32 in the areas corresponding to unexposed areas 28 and a less dense image 33 in areas corresponding to the partial exposure 26.

Hereinabove, a simplified explanation of the imaging mechanism has been provided. A detailed discussion of the mechanism can be found in U.S. Pat. No. 4,399,209 to Sanders et al. The exact mechanism is not clear, but image-wise release/activation of the color precursor in accordance with the degree of exposure is obtained. It appears that either the internal phase in a portion of the microcapsules in the partially exposed areas remains liquid and those capsules rupture upon applying pressure as illustrated in FIGS. 4 and 5, or the internal phase in the microcapsules is partially solidified and the capsules release a portion of the internal phase in accordance with the degree of exposure, or a combination of these mechanisms occurs.

Figure 6:
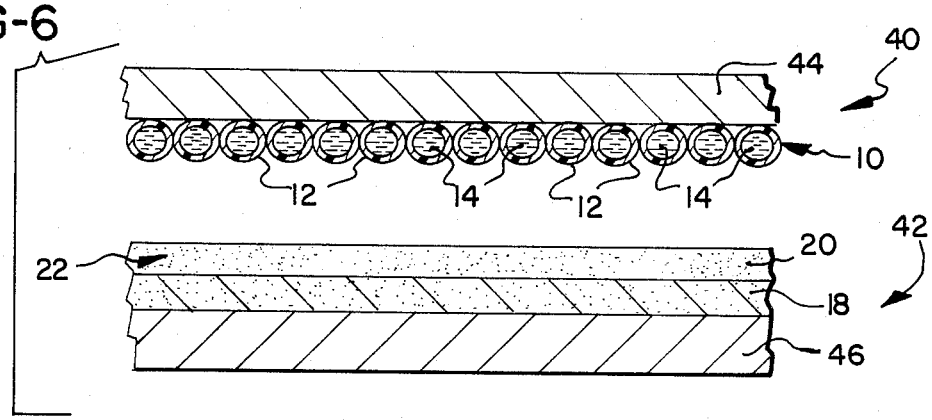
FIG. 6 is a cross-sectional view of a transfer material in accordance with the present invention.

FIG. 6 illustrates a transfer material in accordance with the present invention comprising a transfer sheet 40 and an imaging sheet 42. The transfer sheet includes a support 44 which carries a layer 10 of microcapsules 12 having a liquid internal phase 14 including an image-forming agent and a radiation sensitive composition. The imaging sheet 42 includes a support 46 provided with a developer layer 18 and a sequestering layer 20 containing a pigment or filler 22 which functions to remove a predetermined quantity of the image-forming agent released from the microcapsules and transferred to the sheet 42.

Transfer materials are exposed and developed in a manner analogous to that explained for the self-contained material of FIG. 3. Usually, the transfer sheet 40 is image-wise exposed to actinic radiation. Following its exposure, the transfer sheet 40 is assembled with the imaging sheet 42 and the two sheets in unison are passed through a pressure roller nip with the microcapsule layer 10 in face-to-face contact with the sequestering layer 20 whereupon the capsules rupture and release the internal phase by the mechanism described above.

Analogous to FIG. 5, upon rupturing the capsules on sheet 40 in contact with the imaging sheet 42, the internal phase migrates from the capsule through the sequestering layer 20 and to the color developer layer 18. The same predetermined quantity of the color precursor is removed by the sequestering layer 20 in the unexposed and partially exposed areas to enhance the toe speed.

The encapsulated radiation sensitive compositions used in the present invention must undergo a change in viscosity upon exposure to actinic radiation. These compostions may be positive working or negative working depending upon the nature of the radiation sensitive composition in the internal phase. Hereinabove the present invention has been explained with reference to imaging materials which employ a radiation curable or photohardenable composition but photosoftenable compositions can also be used.

Where the radiation sensitive composition contains a photohardenable composition (e.g., a photopolymerizable or photocrosslinkable material), the internal phase solidifies or increases in viscosity in the exposed areas and positive images are formed. On the other hand, when the microcapsules contain a photosoftenable composition in the internal phase, the internal phase is transformed from a solid or semisolid to a less viscous form by exposure. The internal phase is released in the exposed areas and negative images are formed.

Typical positive-working radiation sensitive compositions include a photoinitiator in combination with a monomer, a dimer, or an oligomer which is polymerizable to a higher molecular weight compound, or a polymer which is crosslinked upon exposure. For a negative working material a compound which is depolymerized or otherwise decomposed upon exposure is used.

Ethylenically unsaturated organic compounds are useful radiation curable materials. These compounds contain at least one terminal ethylene group per molecule. Typically, they are liquid. Ethylenically unsaturated compounds having two or more terminal ethylene groups per molecule are preferred. Examples of this preferred subgroup are ethylenically unsaturated acid esters of polyhydric alcohols, such as trimethylolpropane triacrylate (TMPTA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from The Richardson Company, Melrose Park, Ill. such as RL-1482 and RL-1483. These are recommended to be mixed together to form a radiation curable clear varnish in a ratio of 4.4 parts of RL-1482 to one part RL-1483.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including these isocyanate modified esters and reactive diluents such as tetraethylene glycol diacrylate as well as photoinitiators such as chlorinated resins, chlorinated paraffins and amine photoinitiation synergists are commercially available as over print varnishes from Sun Chemical Corp., Carlstat, N.J. under the tradename of Sun Cure resins.

The radiation sensitive component of several radiation curable inks is also suitable for use in this invention. An example of this type of material is a mixture of pentaerythritol acrylate and a halogenated aromatic, alicyclic or aliphatic photoinitiator, as disclosed in U.S. Pat. No. 3,661,614 to Bessemir et al.

An example of radiation depolymerizable materials that may be useful in other embodiments of the invention are 3-oximino-2-butanone methacrylate which undergoes main chain scission upon U.V. exposure and poly 4'-alkyl acylophenones. See Reichmanis, E.; *Am. Chem. Soc. Div. Org. Coat. Plast. Chem. Prepr.* 1980. 43, 243–251 and Lukac, I.; Chmela S., Int. Conf. on Modif. Polym. 5th. Bratislave, Czech. July 3–6, 1979, I.U.P-.A.C. Oxford, England 1979, 1, 176–182.

The radiation sensitive composition must make up a large enough proportion of the internal phase to effectively control the release of the internal phase upon development. This generally means that the radiation sensitive material must constitute approximately 40 to 99% by weight of the internal phase of the microcapsules.

In most cases, the radiation sensitive composition includes a photoinitiator. It is possible to use either homolytic photoinitiators which are converted to an active species by radiation and generate a radical by abstracting a hydrogen from a hydrogen donor. There may also be used photoinitiators which complex with the sensitizer to produce a free radical generating species or photoinitiators which otherwise generate radicals in the presence of a sensitizer. If the system relies upon ionic polymerization, the photoinitiator may be the anion or cation generating type, depending on the nature of the polymerization.

Examples of photoinitiators useful in the present invention include diaryl ketone derivatives, and benzoin alkyl ethers. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes.

In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy-2-phenylacetophenone, isopropylxanthone and ethyl para-dimethylamino-benzoate. The later is preferably used with TMPTA to provide a radiation sensitive composition.

The amount of imaging photoinitiator in the radiation sensitive composition depends on the particular photosensitive material selected. It must be present in an amount sufficient to initiate the photochemistry within a short exposure time.

Oxygen inhibits the imaging photochemistry. The photoinitiator may be used to sequester oxygen present in the microcapsules by conducting a non-imaging, oxygen sequestering pre-exposure or co-exposure as described in the aforementioned application which causes the initiator to react with the oxygen present within. When the photoinitiator is also relied upon for sequestering oxygen, it must be used in amounts sufficient to fulfill both this and its imaging functions.

The internal phase may additionally include a diluent oil. Inclusion of the oil will often improve half tone gradation in visual images. Examples of carrier oils are alkylated biphenyls (e.g., monoisopropylbiphenyl), polychlorinated eiphenyls, castor oil, mineral oil, deodorized kerosene, naphthenic mineral oils, dibutyl phthalate, dibutyl fumerate, brominated paraffin and mixtures thereof. Alkylated biphenyls are generally less toxic and preferred.

A radiation sensitive composition as described above can be encapsulated in various wall formers using techniques known in the area of carbonless paper including coacervation, interfacial polymerization, polymerization of one or more monomers in an oil, as well as various melting, dispersing and cooling methods. Oil soluble materials have been encapsulated in hydrophilic wall-forming materials such as gelatin-type materials (see U.S. Pat. Nos. 2,730,456 and 2,800,457 to Green et al) including gum arabic, polyvinyl alcohol, carboxymethyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle).

The material used to form the microcapsule walls must be selected for the radiation sensitive composition that is to be encapsulated such that it is substantially transparent to the exposure radiation. For the systems described above, urea-formaldehyde, urea-resorcinol-formaldehyde and gelatin microcapsules are generally preferred. The mean microcapsule size used in the present invention generally ranges from about 1 to 25 microns.

An open phase system may be used instead of discrete microcapsules. This can be done by dispersing what would otherwise be the internal phase throughout a binder as discrete droplets and coating the composition on the substrate. Suitable coatings for this embodiment include polymer binders whose viscosity has been adjusted to match the dispersion required in the coating. Suitable binders are gelatin, polyvinyl alcohol, polyacrylamide, and acrylic lattices.

The sequestering layer comprises an agent which physically or chemically sequesters the image-forming agent mobilized upon rupturing the microcapsules such that a predetermined quantity of the image-forming agent is essentially isolated from the image-forming mechanism upon development such that the predetermined quantity of the image-forming agent does not interact with the developer or otherwise act to produce an image. To be effective, the action of the sequestering agent must be essentially independent of the concentration of the image-forming agent released from the microcapsules (or otherwise mobilized) since essentially the same quantity of image-forming agent must be sequestered in the exposed, partially exposed, and unexposed areas and different amounts of image-forming agents will be mobilized in each of these areas.

Theoretically, there is no lower limit on the predetermined amount of image-forming agent that is sequestered to improve toe speed, because the sequestration of even an infinitisimal amount will theoretically provide some improvement in toe speed. The improvement is generally not appreciable, however, unless at least 1% of the mobilized image-forming agent is sequestered.

The upper limit on the sequestered amount is principally a function of the toe speed and gamma that is desired and the effect which sequestering the image-forming agent has on Dmax. Depending on the imaging system and the nature of the image-forming agent that is used, up to 99% of the mobilized image-forming agent can be sequestered in some imaging materials without reducing Dmax to a point at which image quality is totally unacceptable. In most cases, however, a balance of good toe speed and high Dmax is obtained by sequestering not more than 50% of the mobilized image-forming agent. Generally about 5 to 50% and preferably about 10 to 30% of the mobilized image-forming agent is sequestered in accordance with the present invention.

The sequestering agent can be a pigment which absorbs or adsorbs a predetermined quantity of image-forming agent, or it can be a fixed medium of a reactant which chemically prevents the image-forming agent from migrating to the imaging/developer layer or deactivates the image-forming agent and prevents it from taking part in the image-forming reaction.

One example of a useful physical sequestering agent is a polymeric pigment such as a pigment of a non-film forming latex. Two examples are Dylex 1183 polystrene pigment and Pergopak urea-formaldehyde pigment. Certain inorganic pigments such as silica, diatomacous earth, magnesium silicate, and calcium carbonate can also be used. The pigments used as sequestering agents are preferably substantially colorless particles having a particle size in the range of approximately 0.05 to 5 microns.

Useful chemical sequestering agents include the desensitizing and decolorizing agents conventionally used in the carbonless paper art. Typical examples are amine decolorizing agents, free-radical decolorizing agents, and certain reductive bleaching agents.

Potentially useful examples of amine decolorizing agents are disclosed in U.S. Pat. Nos. 4,125,636 and 4,101,690. Where diazonium coupling compounds are used as the image-forming agent and developer, zinc salts or tin II chloride may be useful sequestering agents. Benzoylperoxide is potentially useful as a free radical decolorizing agent.

Various chelating agents such as EDTA may also be useful as sequestering agents in embodiments in which images are formed by reaction of metal salts to form diazonium compounds or by reaction of metal salts with chelating agents. The sequestering chelating agent traps a predetermined quantity of the metal ions and prevents them from participating in the imaging reaction.

It is also envisioned that certain unsaturated compounds may be useful as chemical sequestering agents to bind color formers having 1,4-unsaturation via a Diels-Alder reaction mechanism.

Figure 7:
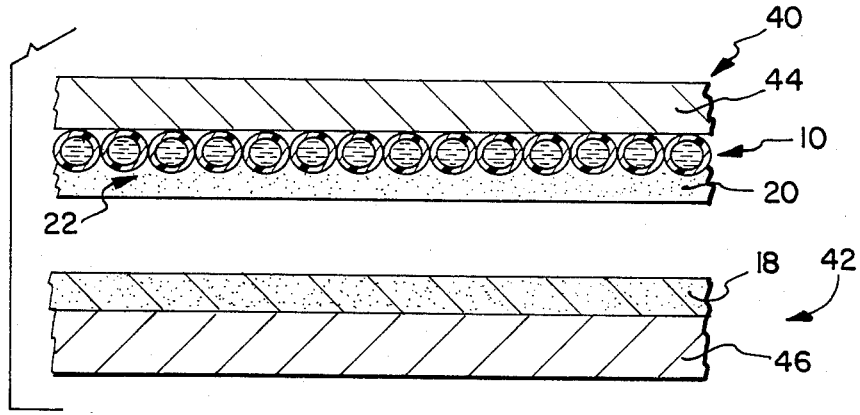
FIG. 7 is a cross-sectional view of a transfer material in accordance with another embodiment of the present invention.

Naturally, if the sequestering layer is interposed between the microcapsule layer and the color developer layer in self-contained imaging sheets, to be useful in these sheets the sequestering agent must be substantially transparent or it will interfere with viewing the image. Non-transparent and even colored pigments can be used in certain transfer materials if, as shown in FIG. 7, the sequestering layer 20 is carried over the microcapsule layer 10 on the transfer sheet 40 instead of over the color developer layer on the imaging sheet as in FIG. 6. Of course, in the embodiment of FIG. 7 the sequestering layer must not interfere with the exposure of the microcapsule layer or the microcapsule layer must be exposable from the opposite side through a transparent support.

It is not necessary that the sequestering agent be provided in a separate layer of the imaging material as illustrated in the drawings. To the contrary, the sequestering agent can be admixed directly with the microcapsules in the microcapsule layer or with the developer material in the developer layer provided that it effectively sequesters a predetermined portion of the image-forming agent from the color forming reaction mechanism.

In addition, it is envisioned that toe speed can also be improved by post exposure treatments which sequester or remove a predetermined quantity of the image forming agent from the system. For example, following capsule rupture, a transfer sheet may be treated with a solvent for the image-forming agent to remove a predetermined quantity of agent from the ruptured capsules, or a developed imaging sheet or self contained sheet may be treated with a decolorizing agent such as a bleaching agent to decolorize a predetermined quantity of the reacted image-forming agent.

Sequestering layers are typically formed by dispersing a sequestering agent such as a pigment in a binder and coating this composition on the color developer layer or microcapsule layer depending upon the construction of the imaging material that is desired. The thickness of the sequestering layer must be sufficient that the layer removes the desired predetermined quantity of mobilized image-forming agent upon development. Appropriate thickness can be determined empirically and will depend on the size and coat weight of the microcapsules and the size and nature of the pigments used. It will also vary for transfer and self-contained sheets. Usually the sequestering layers range from about 1 to 8 mils in thickness.

Binders useful in forming sequestering layers include gelatin, Rhoplex P310 a product of Rhom and Haas Co., poly (vinyl alcohol), starch, etc. Any substantially transparent binder which is compatible with the sequestering agent and its sequestering properties can be used.

The amount of binder used in a sequestering layer is preferably held to a minimum in order to maximize the sequestering capabilities of the pigment and minimize opacity. The exact amount will vary with the type and size of pigment. Typically the amount of binder ranges from about 1 to 2 percent by volumne. A 100% pigment layer would not be undesirable.

Typical color precursors useful in the aforesaid embodiments include colorless electron donating type compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (Hilton-Davis Co.) are often used alone or in combination as color precursors in the present invention.

Illustrative examples of color developers useful in conjunction with the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

Images can also be formed by various other physical and/or chemical reactions using other types of image-forming agents. For example, images can be formed by encapsulating a chelating agent as the image-forming agent which reacts with a metal salt to generate a color image. Some typical examples of useful image-forming pairs of this type are nickel nitrate and N,N' bis(2-octanoyloxyethyl)dithiooxamide, and alum [Fe(111)]and yellow prussiate.

In another embodiment of the present invention the capsules contain a visible dye in the internal phase and images are formed by contacting the exposed imaging material under pressure with a plain paper or a paper treated to enhance its affinity for the visible dye. In this manner the dye transfers to the paper from the areas of the ruptured capsules. Substantially any benign colored dye, i.e., a dye which does not detrimentally attenuate the exposure radiation can be used in this embodiment. A few examples are Sudan Blue and Rhodamine B dyes. The use of colored image-forming agents usually will require that the sequestering layer be present on the transfer sheet as discussed above and shown in FIG. 7.

The image-forming agent may be present in the capsule wall of a discrete capsule or in the binder of an open phase system or in a binder or coating used with discrete capsules or an open phase system in addition to being encapsulated with the radiation sensitive composition. For example, the photosensitive material can be designed such that the image-wise ruptured capsules release a solvent for the image-forming agent or the unpolymerized radiation sensitive composition itself acts as a solvent which dissolves or otherwise renders the image-forming agent mobile. Thus, embodiments are envisioned in which a dye or chromogenic material is fixed in a capsule wall or binder and is released by interaction with the internal phase upon rupturing the capsules.

The most common substrate for the photosensitive material of this invention is paper. The paper may be a commercial impact raw stock, or special grade paper such as cast-coated paper or chrome-rolled paper. The latter two papers are preferred when using microcapsules having a diameter between approximately 1 and 5 microns, because the surface of these papers is smoother and the microcapsules will not be easily embedded in the stock fibers. Transparent substrates such as polyethylene terephthalate and translucent substrates can also be used in this invention.

Imaging sheets embodying the invention imaging system can be exposed using a fairly simple exposure apparatus. In its simplest form for reflection imaging, the apparatus requires only a radiation source, means of focusing the exposure radiation from the original onto the imaging sheet, means to join the imaging sheet with the developer sheet (in the case of a transfer material), and means for rupturing the microcapsules. Simplified means such as this can be used with the invention because development is essentially a dry process with the internal phase and the pigment interacting in only infinitesimal droplets.

The present invention is further illustrated by the following non-limiting examples.

EXAMPLE 1

Photosensitive microcapsules were prepared as follows:

A mixture of 22.6 g 20.4% Isobam, 54.5 g water and 30.8 g gum arabic was heated with stirring to 60° C. and the pH was adjusted to 4.0 with the addition of 20% sulfuric acid. Thereafter 8.3 g urea and 0.8 g resorcinol were added and the solution was maintained at 60° C. to prepare a continuous phase. The continuous phase was placed in a Waring blender and a solution of 50 g TMPTA, 12 g Irgacure G651 (2,2'-dimethoxy-2-phenylaceto-phenone), 1 g Quantacure ITX (isopropyl-thioxanthone), 1 g Quantacure EPD (ethyl para-dimethylamino benzoate and 6 g 50% Copikem X in dibutyl succinate was added at 60° C. with blending at a Variac setting of 90 V for 90 seconds. Thereafter the speed of the blender was reduced to 40 V and 21.4 ml of 37% formaldehyde was added. Blending was continued at that speed for 2 hours at 60° C. The emulsion was then transferred to a metal beaker and 0.6 g of ammonium sulfate in 12.2 g water was added. This emulsion was stirred with an overhead mixer at 60° C. for another hour and the pH was adjusted to 9.0 using a 10% solution of sodium hydroxide. Finally, 2.8 g sodium bisulfite was dissolved in the mixture with stirring.

Transfer imaging sheets were prepared by coating microcapsule batches prepared as above on 80 pound Black and White (B & W) Enamel stock (a product of Mead Corporation), using a No. 12 meyer rod after diluting 1:1 with water containing 1% Triton-X 100 (Rohm and Haas Chemical Co.). The resultant coat weight was 5.3 g/m$^2$.

The developer sheet was prepared as follows: A mixture of 240 g 25% Tamol 731 (Rohm & Haas Co.), 75 g dry HT clay, 1000 g SD-74 Resin (a synthetic developer manufactured by Sanko Chemical Co., Ltd.), 15 g Calgon T (Calgon, Inc.) and 30 g Dequest 20006 (Monsanto Co.) was ground to a particle size of less than 5 microns. 65 parts by weight of the ground mixture was added to 25 parts HT clay and 10 parts Dow 501 Latex (Dow Chemical Co.). This mixture was coated on Schoeller grade P314-A stock using a No. 10 Meyer rod in a coat weight of 5.7 g/m$^2$. Over this acid developer was coated a mixture consisting of 84.5% Lytron 2503 (Monsanto), 13.5% Rhoplex P-310, and 2% of a 5% dilution of Klucel L in water, the entire mixture being diluted to 20% solids. The coating was made with a No. 16 wire-wound rod to result in a coatweight of 6.4 g/m².

A control developer sheet which did not contain this second coating was also prepared.

Figure 8:
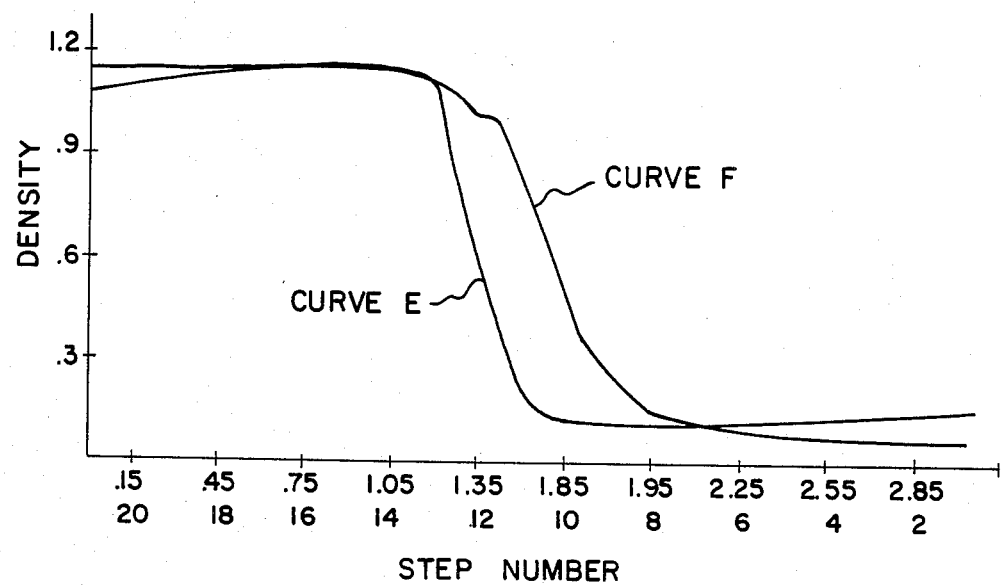
FIG. 8 is the H & D curves for the imaging materials described in the Example.

The sheet containing the microcapsules was exposed through a step tablet (0.15 density increments) with a light source consisting of one F15T8/BL tube and one 15T8 D (15 watts) for four seconds. The sample was 11 cm from the tube surface. Following exposure, the transfer sheet was passed between two pressure rollers in contact with the developer sheet described above. In FIG. 8 the H & D curves of the sequestered (curve E) and control (curve F) developer sheets are shown. As can be seen, toe speed is increased by about 1½ f-stops over the control in accordance with the present invention. The photographic characteristics of the materials are summarized in the Table below

TABLE

|  | Invention | Control |
| --- | --- | --- |
| Dmax | 1.13 | 1.14 |
| Dmin | .06 | .08 |
| Gamma | 3.22 | 1.64 |
| Toe Speed (Step No.) |  |  |
| 10% above Dmin | 10.92 | 8.37 |
| 25% above Dmin | 11.61 | 9.52 |

Having described the invention in detail and with respect to specific embodiments thereof, it will be apparent that numerous variations and modifications are possible without departing from the scope of the following claims:

What is claimed is:

1. A self-contained photosensitive imaging material comprising:
   a support;
   a layer of microcapsules on said support, said microcapsules containing an internal phase including a photohardenable composition;
   a color-forming agent associated with said microcapsules such that upon rupturing said microcapsules and releasing said internal phase said color-forming agent is mobilized;
   a developer material capable of reacting with said color-forming agent and producing an image provided on the same surface of said support as said layer of rupturable microcapsules in a layer underlying said layer of microcapsules; and
   means for sequestering a predetermined amount of said mobilized color-forming agent and preventing said predetermined amount of said color-forming agent from reacting with said developer material and forming an image; said means for sequestering being provided in a layer interposed said layer of microcapsules and said layer of developer material;
   said photosensitive material being useful in forming images by image-wise exposing said material to actinic radiation and rupturing said microcapsules whereupon said color-forming agent is image-wise mobilized, a predetermined amount of said mobilized color-forming agent is sequestered, and the balance of said color-forming agent produces an image.

2. The self-contained photosensitive imaging material of claim 1 wherein said microcapsules have discrete capsule walls.

3. The self-contained photosensitive imaging material of claim 2 wherein said photohardenable composition comprises a polyethylenically unsaturated compound and a photoinitiator.

4. The self-contained photosensitive imaging material of claim 3 wherein said color former is encapsulated with said internal phase.

5. The self-contained photosensitive imaging material of claim 1 wherein said sequestering means includes a pigment which absorbs or adsorbs a predetermined amount of said mobilized image-forming agent and prevents said predetermined amount of said color-forming agent from reacting with said developer.

6. A transfer photosensitive imaging material comprising:
   an imaging sheet including:
   a first support,
   a layer of rupturable microcapsules on said first support, said microcapsules containing an internal phase including a photohardenable composition, and
   a color-forming agent associated with said microcapsules on said first support such that upon rupturing said microcapsules and releasing said internal phase, said color-forming agent is mobilized; and
   a developer sheet including,
   a second support,
   a developer agent capable of reacting with said color-forming agent and producing an image provided on said second support, and
   means for sequestering a predetermined amount of said mobilized color-forming agent and thereby preventing said predetermined amount of said mobilized color-forming agent from reacting with said developer material and forming an image upon transfer to said developer sheet, said means for sequestering being provided on said second support,
   said photosensitive imaging material being useful in forming images by image-wise exposing said imaging sheet to actinic radiation, rupturing said microcapsules, and contacting said layer of microcapsules on said imaging sheet with said developer agent on said developer sheet where upon rupturing said microcapsules, said color-forming agent is mobilized image-wise and transferred to said developer sheet, and a predetermined quantity of said image-forming agent is prevented from reacting with said developer agent.

7. A transfer imaging material of claim 6 wherein said microcapsules have discrete capsule walls.

8. The transfer imaging material of claim 7 wherein said photohardenable composition includes a polyethylenically unsaturated compound and a photoinitiator.

9. The transfer imaging material of claim 8 wherein said sequestering means is provided on said developer sheet in said layer of said developer agent or in a separate layer overlying said layer of said developer agent.

10. The transfer imaging material of claim 9 wherein said means for sequestering said mobilized image-forming agent includes a pigment which absorbs or adsorbs a predetermined quantity of said color-forming agent and prevents said predetermined quantity of said color-forming agent from reacting with said developer material and forming an image.

11. The transfer imaging material of claim 9 wherein said means for sequestering said mobilized color-forming agent is a chemical sequestering agent which chemically reacts with a predetermined amount of said image-forming agent and thereby prevents said predetermined amount of said color-forming agent from forming an image.

* * * * *